(12) United States Patent
Pandey et al.

(10) Patent No.: US 12,183,559 B2
(45) Date of Patent: Dec. 31, 2024

(54) APPARATUS FOR TEMPERATURE CONTROL IN A SUBSTRATE PROCESSING CHAMBER

(71) Applicant: Applied Materials, Inc., Santa Clara, CA (US)

(72) Inventors: Vishwas Kumar Pandey, Bangalore (IN); Colin John Dickinson, San Jose, CA (US); Dinkesh Huderi Somanna, San Jose, CA (US); Ala Moradian, San Jose, CA (US); Kartik Bhupendra Shah, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 242 days.

(21) Appl. No.: 17/508,493

(22) Filed: Oct. 22, 2021

(65) Prior Publication Data

US 2023/0128611 A1     Apr. 27, 2023

(51) Int. Cl.
*H01J 37/34* (2006.01)
*C23C 14/34* (2006.01)
*C23C 14/50* (2006.01)
*H01J 37/32* (2006.01)

(52) U.S. Cl.
CPC .......... *H01J 37/3441* (2013.01); *C23C 14/34* (2013.01); *C23C 14/50* (2013.01); *H01J 37/32522* (2013.01); *H01J 2237/002* (2013.01); *H01J 2237/332* (2013.01)

(58) Field of Classification Search
None
See application file for complete search history.

(56) References Cited

U.S. PATENT DOCUMENTS

| 9,909,206 | B2 | 3/2018 | Johanson et al. |
| 10,546,733 | B2 | 1/2020 | Savandaiah et al. |
| 2008/0006523 | A1 | 1/2008 | Hosokawa et al. |
| 2008/0178797 | A1* | 7/2008 | Fodor ............... C23C 16/46 118/75 |
| 2008/0257263 | A1* | 10/2008 | Pavloff ............ H01J 37/3441 118/723 R |
| 2011/0278165 | A1* | 11/2011 | Rasheed ........... H01J 37/3411 204/298.11 |
| 2014/0027275 | A1 | 1/2014 | Kao |

(Continued)

OTHER PUBLICATIONS

International Search Report and Written Opinion for PCT/US2022/044869 dated Jan. 20, 2023.

*Primary Examiner* — Jeffrie R Lund
*Assistant Examiner* — Tiffany Z Nuckols
(74) *Attorney, Agent, or Firm* — MOSER TABOADA

(57) ABSTRACT

An adapter for a deposition chamber includes an adapter body extending longitudinally about a central axis between an upper side and lower side opposite the upper side. The adapter body has a central opening about the central axis. The adapter body has a radially outer portion having a connection surface on the lower side and a radially inner portion having a coolant channel and a stepped surface on the lower side. At least a portion of the coolant channel is spaced radially inwardly from a radially inner end of the connection surface. At least the portion of the coolant channel is disposed longitudinally below the connection surface between the connection surface and the stepped surface.

20 Claims, 9 Drawing Sheets

(56) References Cited

U.S. PATENT DOCUMENTS

| | | | |
|---|---|---|---|
| 2014/0238609 A1* | 8/2014 | Tomioka | H01L 21/6875 279/128 |
| 2015/0354054 A1* | 12/2015 | Fruchterman | H01J 37/3411 165/177 |
| 2016/0204009 A1* | 7/2016 | Nguyen | H01L 21/67109 165/80.4 |
| 2017/0076924 A1 | 3/2017 | Johanson et al. | |
| 2017/0098530 A1 | 4/2017 | Johanson et al. | |
| 2018/0142340 A1 | 5/2018 | Johanson et al. | |
| 2019/0096638 A1* | 3/2019 | Lavitsky | H01J 37/32449 |
| 2021/0292888 A1 | 9/2021 | Lavitsky et al. | |
| 2021/0351016 A1 | 11/2021 | Chang et al. | |

* cited by examiner

APPARATUS FOR TEMPERATURE CONTROL IN A SUBSTRATE PROCESSING CHAMBER

FIELD

Embodiments of the present disclosure generally relate to devices and methods for controlling external and internal temperatures of process chambers, such as those used in microelectronic device fabrication.

BACKGROUND

SEMI S2 is an environmental, health, and safety guideline for semiconductor manufacturing equipment. According to the SEMI S2 guidelines, the temperature for external surfaces of a chamber, such as a process chamber for substrates, that can come into contact with a human should be less than or equal to 65° C. The inventors have observed that the external temperature of some process chambers, such as physical deposition (PVD) chambers, can exceed the current limit of 65° C.

Accordingly, the inventors have provided embodiments of improved devices and methods to control the temperature of external surfaces of process chambers without affecting the internal thermal environment.

SUMMARY

Apparatus and methods for controlling the temperature of external surfaces of process chambers are provided herein. In some embodiments, an adapter for a deposition chamber includes an adapter body extending longitudinally about a central axis between an upper side and lower side opposite the upper side. The adapter body has a central opening about the central axis. The adapter body has a radially outer portion having a connection surface on the lower side and a radially inner portion having a coolant channel and a stepped surface on the lower side. At least a portion of the coolant channel is spaced radially inwardly from a radially inner end of the connection surface. At least the portion of the coolant channel is also disposed longitudinally below the connection surface between the connection surface and the stepped surface on the lower side.

In some embodiments, a deposition chamber includes an adapter body, a chamber body, an inner shield, and an outer shield. The adapter includes an adapter body extending longitudinally about a central axis between an upper side and lower side opposite the upper side. The adapter body has a central opening about the central axis. The adapter body having a radially outer portion having a connection surface on the lower side and a radially inner portion having a coolant channel and a stepped surface on the lower side. At least a portion of the coolant channel is spaced radially inwardly from a radially inner end of the connection surface, and at least the portion of the coolant channel is disposed longitudinally below the connection surface between the connection surface and the stepped surface.

The chamber body defines an internal cavity surrounding a heater for heating an interior volume of the internal cavity. The chamber body has a connection surface defining an opening of the chamber body coaxial with the central opening of the adapter body. The connection surface of the adapter body is connected to the connection surface of the chamber body.

The outer shield extends longitudinally and radially from the stepped surface and the inner shield extends longitudinally and radially from the upper side of the adapter body toward the stepped surface and extending partially over the outer shield.

In some embodiments a process kit for a deposition chamber includes an adapter, an inner shield, and an outer shield. The adapter includes an adapter body extending longitudinally about a central axis between an upper side and lower side opposite the upper side. The adapter body has a central opening about the central axis. The adapter body having a radially outer portion having a connection surface on the lower side and a radially inner portion having a coolant channel and a stepped surface on the lower side. At least a portion of the coolant channel is spaced radially inwardly from a radially inner end of the connection surface, and at least the portion of the coolant channel is disposed longitudinally below the connection surface between the connection surface and the stepped surface.

The outer shield extends longitudinally and radially from the stepped surface and the inner shield extends longitudinally and radially from the upper side of the adapter body toward the stepped surface and extending partially over the outer shield.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of adapters, process kits incorporating such adapters, process chambers incorporating such process kits, and methods of use to control the external temperature of process chambers are provided herein.

Figure 1A:
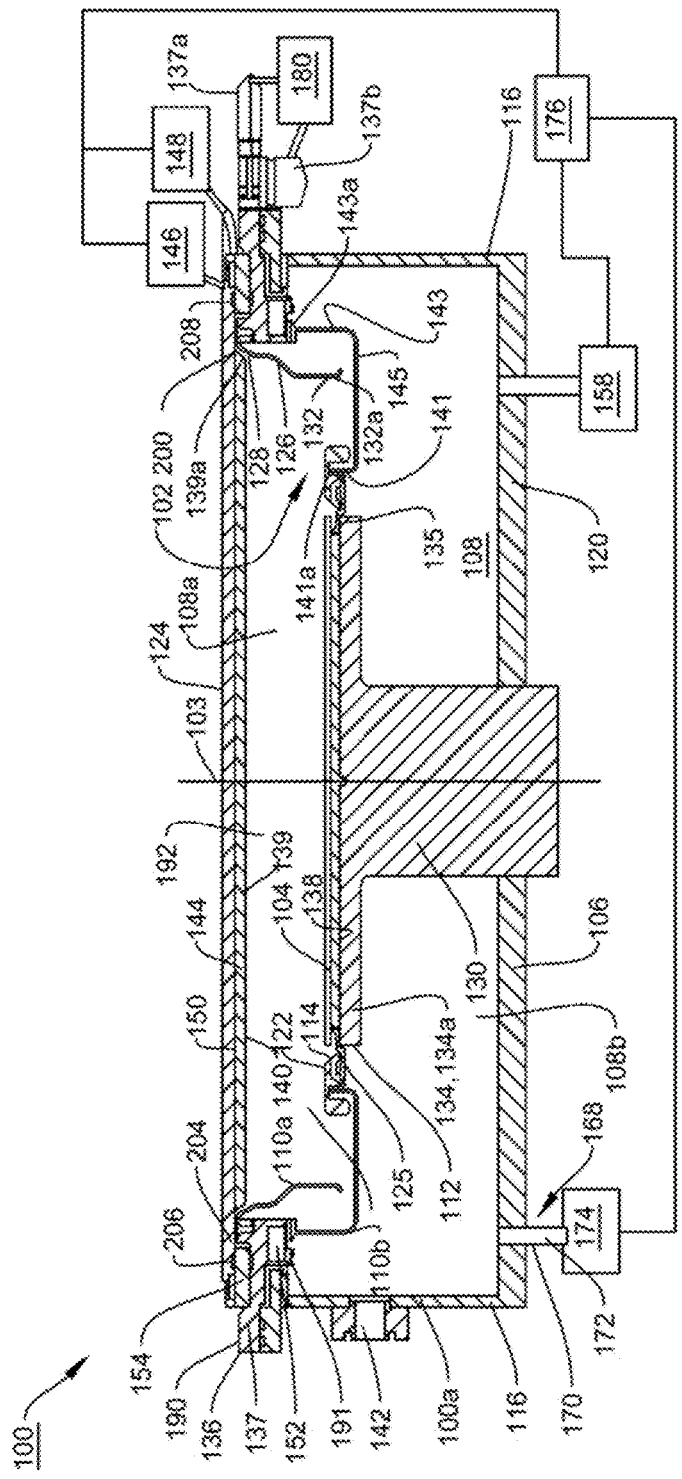
FIG. 1A is a cross-sectional side view of a process chamber in accordance at least some embodiments of the present disclosure.

FIG. 1A depicts a cross-sectional side view of a process chamber 100 (e.g., a physical vapor deposition, or PVD, chamber). The process chamber 100 comprises a chamber body 100a having chamber walls 106 that enclose an inner volume 108. In embodiments, one or more of the chamber walls 106 may include an inspection port (not shown) or window for viewing the inner volume 108. The chamber walls 106 include sidewalls 116, a bottom wall 120, and a ceiling 124. The process chamber 100 can be a standalone chamber or a part of a multi-chamber platform (not shown) having a cluster of interconnected chambers connected by a substrate transfer mechanism that transfers substrates 104 between the various chambers. The chamber walls 106 may be made from a suitable material based on thermal environment, such as stainless steel. The process chamber 100 may be a PVD chamber capable of sputter depositing material onto a substrate 104. Other process chambers may also benefit from the inventive apparatus and methods disclosed herein. Non-limiting examples of suitable materials for sputter deposition include one or more of aluminum, copper, tantalum, tantalum nitride, titanium, titanium nitride, tungsten, tungsten nitride, molybdenum, or the like.

Figure 1B:
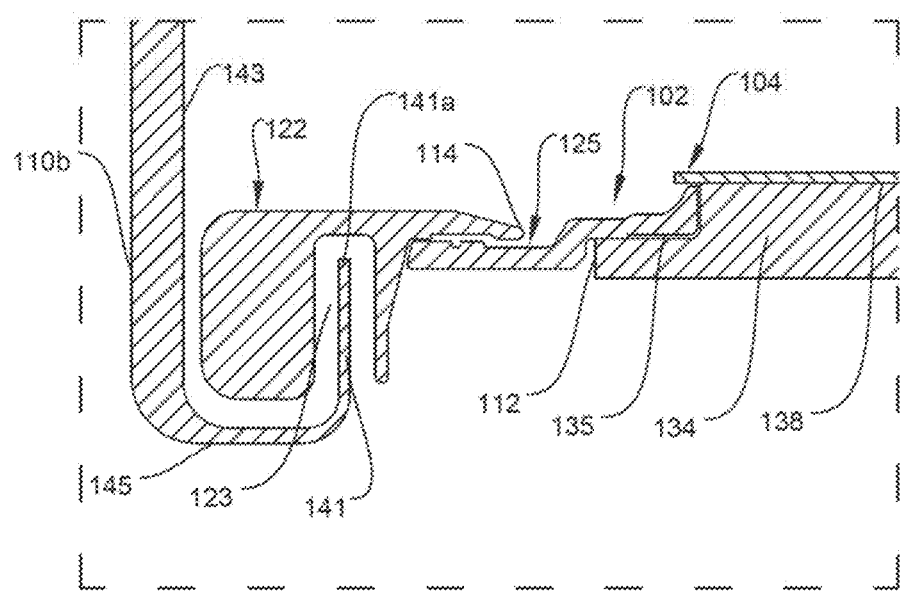
FIG. 1B is an alternate embodiment of a portion of the process chamber shown in FIG. 1A in accordance with at least some embodiments of the present disclosure.

The process chamber 100 generally includes a substrate support 130 which comprises a pedestal 134 to support the substrate 104 (e.g., a silicon wafer). The pedestal 134 has a substrate support surface 138 having a plane substantially parallel to a sputtering surface 139 of a sputtering target 140 disposed in an upper section of the process chamber 100. The substrate support surface 138 of the pedestal 134 is designed to support the substrate 104 during processing. The pedestal 134 may be configured to be raised and lowered. In FIG. 1A, the pedestal 134 is shown in an intermediate position, below a process position. FIG. 1B, discussed in greater detail below, shows an alternate embodiment of a process kit 102 and pedestal 134 and shows the pedestal 134 in a raised, process position above the intermediate position. The substrate support surface 138 may be formed from aluminum oxide. The width of the substrate 104 may be a diameter if the substrate 104 is round or a width if the substrate is square/rectangular. The substrate support surface 138 may have a size that is less than the given width of the substrate 104 such that the substrate includes an overhanging edge, as shown in FIGS. 1A and 1B. The pedestal 134 may include at least one of an electrostatic chuck or a heater 134a (such as an electrical resistance heater, heat exchanger, or other suitable heating device). In embodiments, the heater 134a may be configured to heat the substrate support surface 138 to a temperature up to about 700° C.

In operation, a substrate 104 is introduced into the process chamber 100 or taken out from the process chamber 100 through a substrate-loading inlet 142 in the sidewall 116 of the chamber body 100a and placed onto or taken off of the substrate support surface 138, respectively. The pedestal 134 is moved to the process position for processing the substrate 104. The pedestal 134 can be maintained at an electrically floating potential or grounded during plasma operation.

The process chamber 100 may have a process kit 102 in accordance with some embodiments of the present disclosure. Process kits 102 may be used in the process chamber 100 to separate a processing volume 108a from a non-processing volume 108b. The process kit 102 may include various components that can be easily removed from the process chamber 100, for example, to clean sputtering deposits off the component surfaces, replace, or repair eroded components, or to adapt the process chamber 100 for particular processes. The process kit 102 may include one or more of an adapter 136, an inner shield 110a, an outer shield 110b, a cover ring 122, and a deposition ring 125.

The adapter 136 includes an adapter body 137 having a coolant channel 152 to flow a coolant, such as deionized water. The adapter body 137 extends longitudinally about a central axis 103 between an upper side 190 and lower side 191 opposite the upper side 190. The adapter body 137 has a central opening 192 about the central axis 103.

The adapter body 137 includes a coolant inlet 137a and a coolant outlet 137b in communication with the coolant channel 152. The coolant inlet 137a and coolant outlet 137b may be fluidly coupled to a coolant supply 180. The coolant supply 180 can be configured to flow the coolant through the coolant channel 152 at a flowrate, sufficient to maintain the temperature of external surfaces of the adapter body 137 and the chamber walls 106 of the chamber body 100a below a predetermined temperature or SEMI S2 standard limit, such as below or equal to 65° C. In some embodiments, for example, deionized water is used as the coolant and circulates in the coolant channel 152 at about 0.5 gallons per minute to 5 gallons per minute maintain the temperature of external surfaces of the adapter 136 and the chamber walls 106 at or below 65° C. when the temperature of the processing volume 108a of the process chamber 100 is about 700° C. The temperature of the coolant entering the coolant inlet 137a may be at a temperature of about 20° C. to 35° C. and the temperature of the coolant exiting the coolant outlet 137b may be at a temperature of about 21° C. to 40° C.

As shown in greater detail in FIGS. 2A-2G, the adapter body 137 may have a radially outer portion 193 having a connection surface 194 on the lower side 191 and a radially inner portion 195 having the coolant channel 152 and a stepped surface 196 on the lower side 191. The upper side 190 may have a stepped surface as shown in FIGS. 2A-2G. The stepped surface 196 may be disposed wholly or partially below the connection surface 194. In embodiments, the radially outer portion 193 extends radially outwardly from a radially inner end 199 of the connection surface 194, and the radially inner portion 195 extends radially inwardly from the radially inner end 199 of the connection surface 194. At least a portion of the coolant channel 152 is spaced radially inwardly from the radially inner end 199 of the connection surface 194. In the embodiments shown in FIGS. 2A-2D, the entire coolant channel 152 is spaced radially inwardly from the radially inner end 199 of the connection surface 194. Also, at least the portion of the coolant channel 152 is disposed longitudinally below the connection surface 194 and between the connection surface 194 and the stepped surface 196. In the embodiments shown in FIGS. 2A-2D, the entire coolant channel 152 is disposed longitudinally below the connection surface 194 and between the connection surface 194 and the stepped surface 196.

Figure 2A:
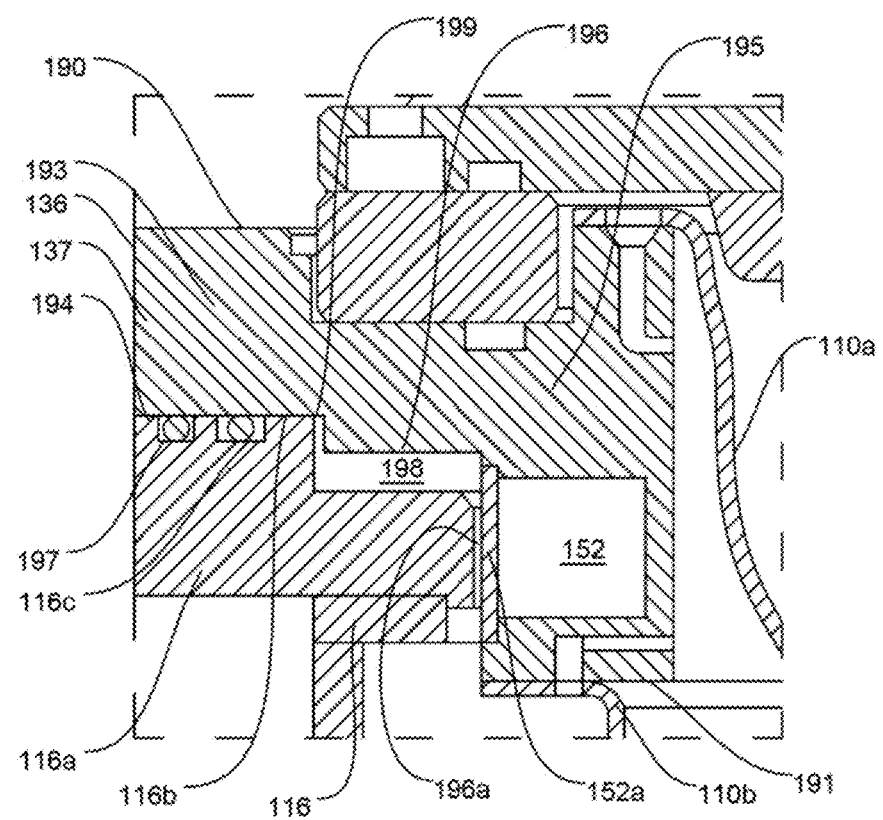
FIG. 2A is a detailed view of a portion of the process chamber shown in FIG. 1A in accordance with at least some embodiments of the present disclosure.
Figure 2B:
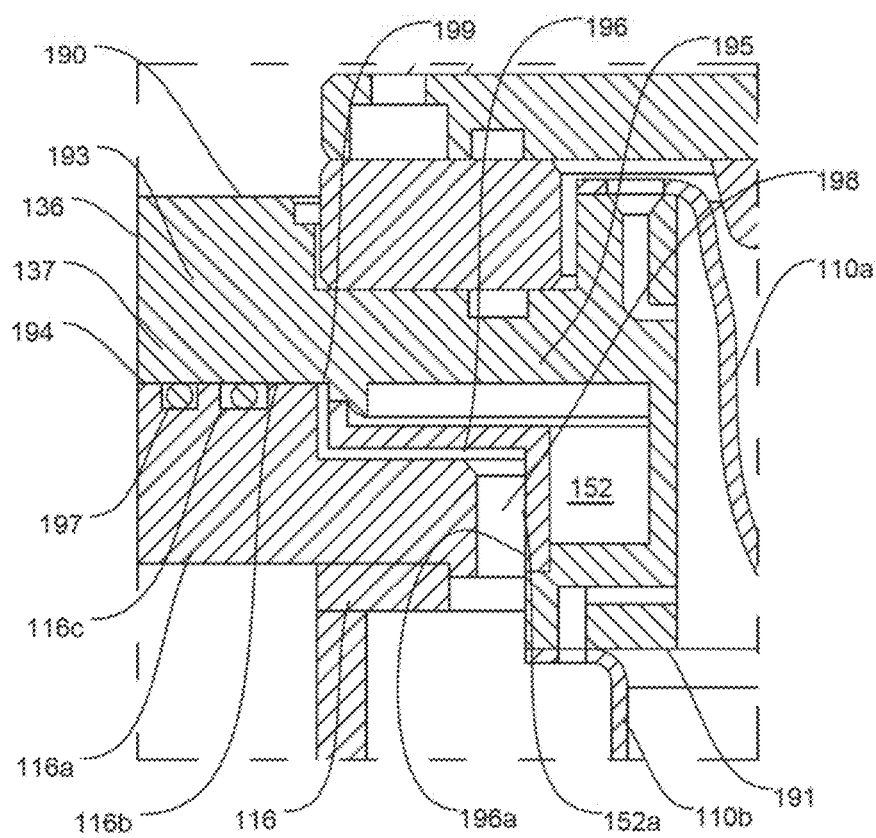
FIG. 2B is an alternate embodiment of the portion of the process chamber shown in FIG. 2A in accordance with at least some embodiments of the present disclosure.
Figure 2C:
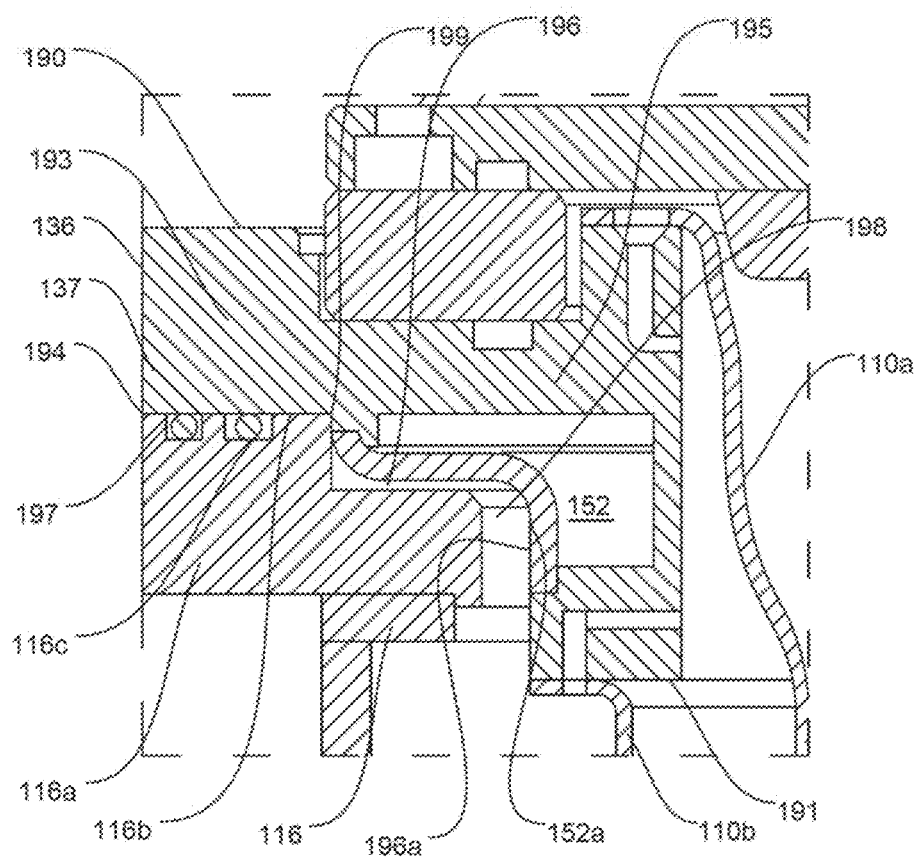
FIG. 2C is an alternate embodiment of the portion of the process chamber shown in FIG. 2A in accordance with at least some embodiments of the present disclosure.
Figure 2D:
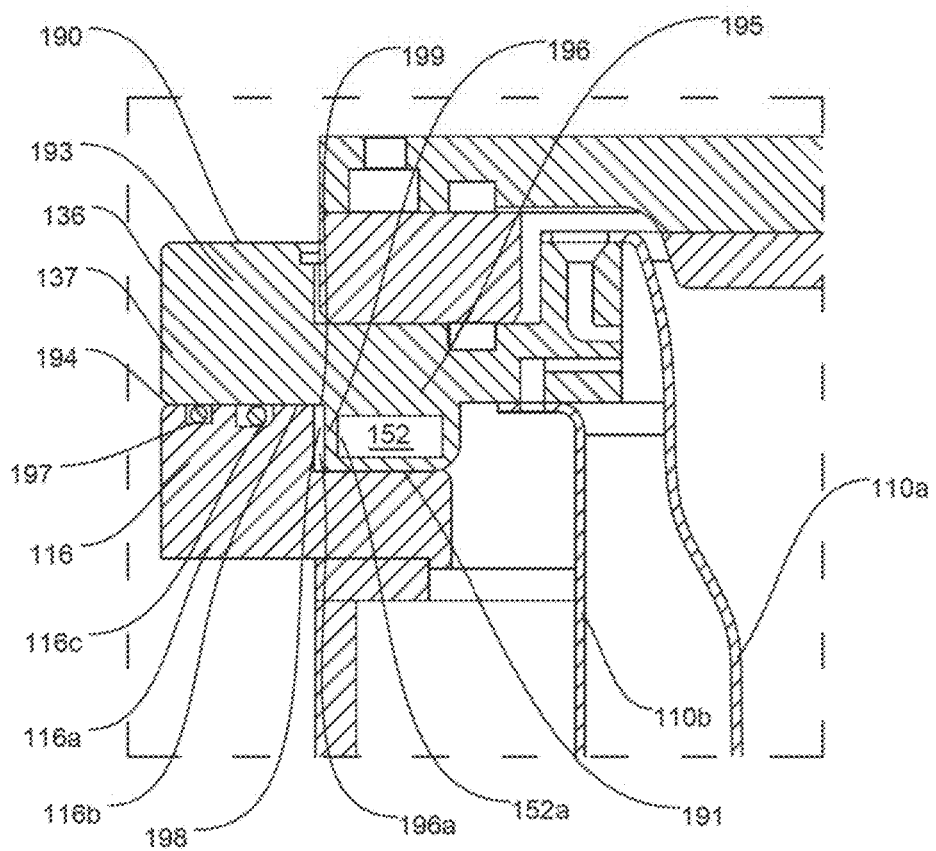
FIG. 2D is an alternate embodiment of the portion of the process chamber shown in FIG. 2A in accordance with at least some embodiments of the present disclosure.
Figure 2E:
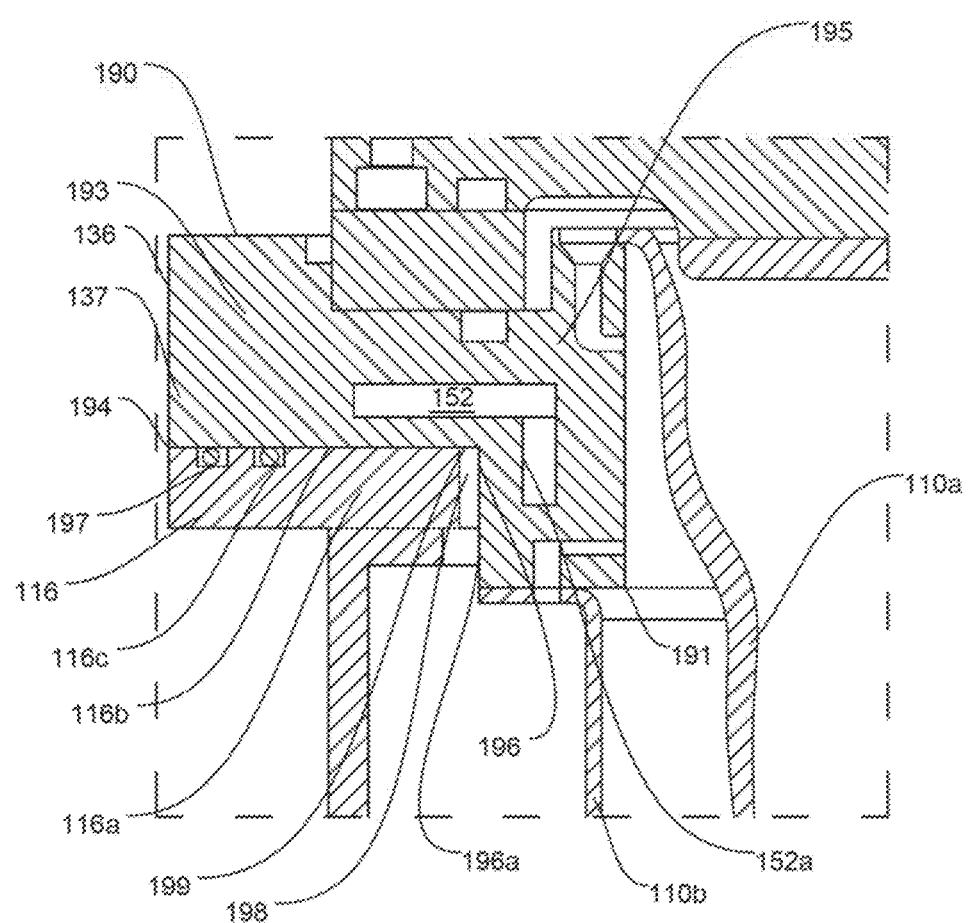
FIG. 2E is an alternate embodiment of the portion of the process chamber shown in FIG. 2A in accordance with at least some embodiments of the present disclosure.
Figure 2F:
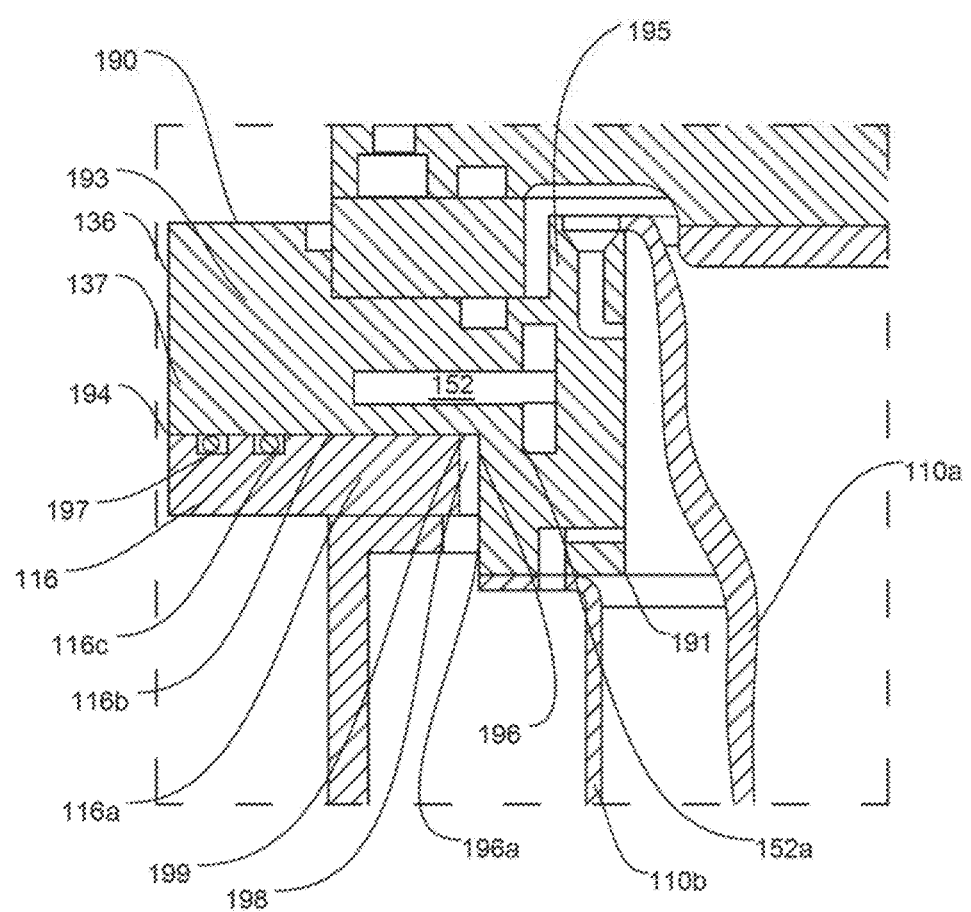
FIG. 2F is an alternate embodiment of the portion of the process chamber shown in FIG. 2A in accordance with at least some embodiments of the present disclosure.
Figure 2G:
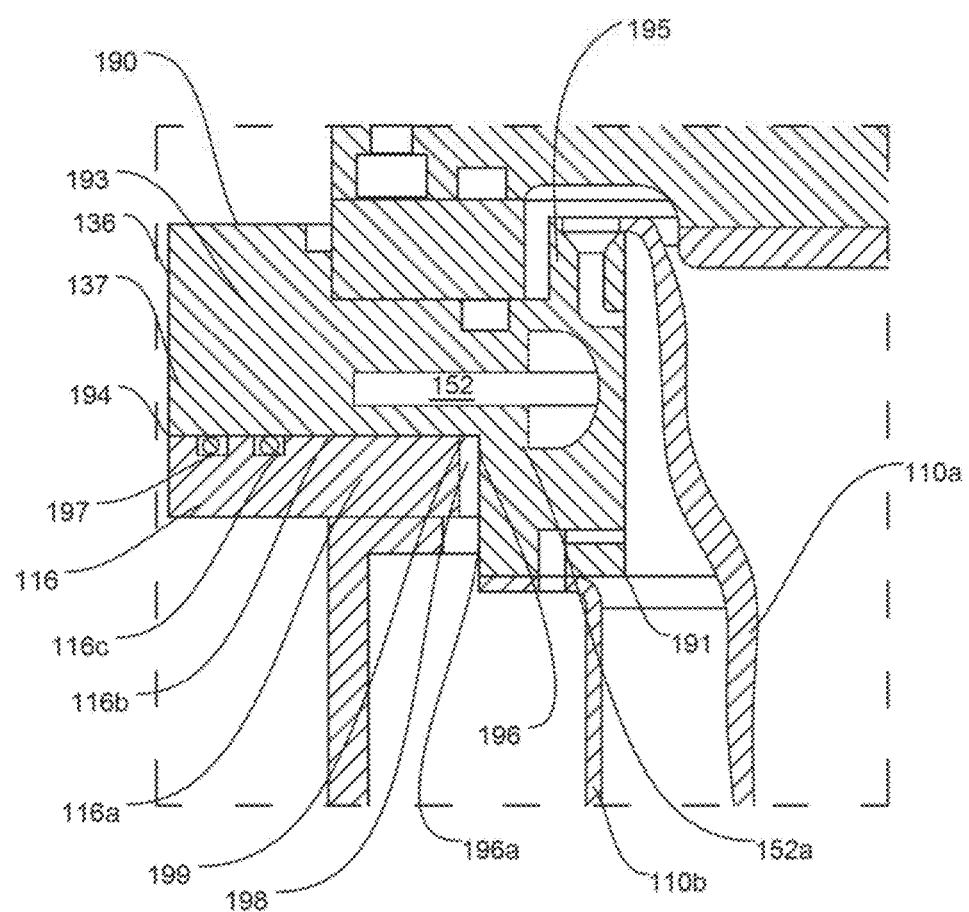
FIG. 2G is an alternate embodiment of the portion of the process chamber shown in FIG. 2A in accordance with at least some embodiments of the present disclosure.

The coolant channel 152 may have a profile that has at least one surface that conforms to at least a portion of the stepped surface 196. For example, as shown in FIG. 2A, the coolant channel 152 may have a square profile and at least one side 152a that extends parallel to an adjacent portion 196a of the stepped surface 196. The coolant channel 152 may have various polygonal shapes, including an L-shaped profile shown in FIGS. 2B, 2C, and 2E, a rectangular profile shown in FIG. 2D, a T-shaped profile shown in FIG. 2F, and a mushroom shaped profile shown in FIG. 2G.

The coolant channel 152 may be machined directly into the adapter body 137, or may be formed as a separate (e.g., machined or stamped) part, such as in the form of a ring, that may be attached to the adapter body 137, such as by welding to form the adapter 136. For example, the coolant channel 152 may be machined directly into the adapter body 137 along an outer perimeter of the adapter body 137 and covered with a cap attached to the adapter body to seal the coolant channel 152. Also, when the adapter body 137 is connected to the chamber body 100a as shown in FIGS. 2A-2G, a gap 198 may be formed between a portion of the stepped surface 196 and one or more opposing surfaces of the sidewall 116 of the chamber body 100a. In the embodiments shown in FIGS. 2A-2C and 2E-2G, at least an L-shaped portion of the stepped surface 196 is spaced from opposing surfaces of the sidewall 116 forming the gap 198 which has at least an L-shaped portion.

As shown in FIGS. 2A-2G, the sidewall 116 may have a flange 116a with a connection surface 116b that connects with the connection surface 194 of the adapter body 137. The adapter body 137 may extend over and/or around the flange 116a to shield the flange 116a and dispose the coolant channel 152 radially inwardly of and below the connection surface 116b and the connection surface 194.

The connection surface 194 and the connection surface 116b may be mating sealing surfaces. For example, as shown in FIG. 2A, the connection surface 116b includes grooves 116c in which O-rings 197 are seated. The connection surface 194 of the adapter body 137 seals against the O-rings 197.

As shown in FIGS. 2A-2G, the radially inner portion 195 of the adapter body 137 may have at least one section having an L-shaped profile. Moreover, the coolant channel 152 may be disposed in the section having the L-shaped profile, as shown in FIGS. 2A-2D. Also, as shown more specifically in FIGS. 2B, 2C, and 2E the coolant channel 152 in such section may have an L-shaped profile.

Referring to FIG. 1A, the adapter body 137 supports and disposes the inner shield 110a and the outer shield 110b in the inner volume 108, and, more specifically, the processing volume 108a. The inner shield 110a and the outer shield 110b may be made from a metal, such as stainless steel that is thermally conductive. The inner shield 110a and/or the outer shield 110b may have plurality of holes or slots as flow passage to permit the flow of gas, such as, for example, to an exhaust 168. Because the inner shield 110a and outer shield 110b are connected to the adapter body 137, heat generated in the inner volume 108 (e.g., from operating the heater 134a) can be conducted by the inner shield 110a and the outer shield 110b to the radially inner portion 195 of the adapter body. Also, the spaced arrangement of the inner shield 110a and the outer shield 110b acts to convect heat to the radially inner portion 195 of the adapter body 137. Because the coolant channel 152 is disposed in the radially inner portion 195 and is below the connection surface 194, heat that is both convected and conducted by the inner shield 110a and the outer shield 110b into the adapter body 137, can be at least partially transferred to coolant in the coolant channel 152 before the heat reaches the radially outer portion 193 and the connection surface 194. By reducing the amount of heat reaching the connection surface 194, the coolant in the coolant channel 152 can limit the heat transmitted from the adapter body 137 to the chamber walls 106 of the chamber body 100a that are in thermal contact with the adapter body 137. As a result, the temperature of external surfaces of the chamber body 100a can be maintained.

In some embodiments, the inner shield 110a includes a cylindrical wall 126 having a diameter sized to encircle the sputtering surface 139 of the sputtering target 140 and the substrate support 130 (e.g., a diameter larger than the sputtering surface 139 and larger than the support surface of the substrate support 130). The cylindrical wall 126 has an upper portion 128 and a lower portion 132 with a free end 132a. The upper portion 128 is connected to the upper side 190 of the adapter body 137. Also, the upper portion 128 surrounds the outer edge 139a of the sputtering surface 139 of the sputtering target 140. The lower portion 132 at least partially surrounds the substrate support 130.

The outer shield 110b has a generally U-shaped or J-shaped profile having an inner wall 141, an outer wall 143, and a bottom wall 145 connecting the inner wall 141 to the outer wall 143. An upper end 143a of the outer wall 143 is connected to the lower side 191 of the adapter body 137. The upper end 141a of the inner wall 141 of the outer shield 110b interfaces with the cover ring 122. For example, in the embodiment shown in FIG. 1A, an upper end 141a of the inner wall 141 is covered by a groove formed in a bottom surface of a cover ring 122 for placement about a peripheral wall 112 of the substrate support 130. The adapter 136 supports the inner shield 110a and the outer shield 110b so that the inner shield 110a hangs down at least partially over the outer shield 110b and is disposed radially between the inner wall 141 and the outer wall 143 of the outer shield 110b.

The process kit 102 may also include a deposition ring 125 disposed below the cover ring 122. The cover ring 122 at least partially covers the deposition ring 125 and inner wall 141 of the outer shield 110b. In the embodiment shown in FIG. 1A, the deposition ring 125 is surrounded by the inner wall 141 of the outer shield 110b. The deposition ring 125 may have an annular band that extends about and surrounds the peripheral wall 112 of the substrate support 130 as shown in FIG. 1A. The deposition ring 125 may sit on a lower ledge 135 of the substrate support 130. In some embodiments, a distance between the substrate support surface 138 and an upper surface of the lower ledge 135 is about 8 to about 11 mm. In some embodiments, the lower ledge 135 has a thickness of about 10 mm to about 15 mm.

In FIG. 1A, the pedestal 134 is shown in an intermediate position where the cover ring 122 is not in contact with the deposition ring 125. In FIG. 1A, the cover ring 122 is shown resting on the upper end 141a of the inner wall 141 of outer shield 110b. FIG. 1B shows an alternate embodiment of the pedestal 134, cover ring 122, and deposition ring 125 where the pedestal 134 is in the process position. As shown in FIG. 1B, the cover ring 122 rests on the deposition ring 125.

The cover ring 122 and the upper end 141a of the inner wall 141 of the outer shield 110b cooperate with one another to reduce formation of sputter deposits on the peripheral walls 112 of the substrate support 130 and an overhanging edge 114 of the substrate 104. Specifically, as shown in the embodiment of FIG. 1B, the cover ring 122 is sized, shaped, and positioned to cooperate with and complement the inner wall 141 of the outer shield 110b to form a tortuous flow path 123 between the cover ring 122 and the inner wall 141, thus inhibiting the flow of process deposits onto the peripheral wall 112. The tortuous flow path 123 restricts the build-up of low-energy sputter deposits on the mating surfaces of the deposition ring 125 and cover ring 122, which would otherwise cause the deposition ring 125 and cover ring 122 to stick to one another or to the overhanging edge 114 of the substrate 104.

As shown in FIG. 1A, the sputtering target 140 comprises a sputtering plate 144 mounted to a backing plate 150. The sputtering plate 144 comprises a material to be sputtered onto the substrate 104. For example, the sputtering plate 144 can be a metal, such as, for example aluminum, copper, tungsten, titanium, molybdenum, cobalt, nickel or tantalum. The sputtering plate 144 can also be a metal compound, such as for example, tantalum nitride, tungsten nitride or titanium nitride. The sputtering plate 144 may have a sputtering surface 139 that forms a plane that is parallel to the plane of the substrate 104. The outer edge 139a surrounds the sputtering surface 139. The outer edge 139a may be inclined relative to the plane of the sputtering surface 139.

The outer edge 139a that is adjacent to the upper portion 128 of the inner shield 110a forms a gap 200 comprising a dark space region. The dark space region is an area which is highly depleted of free electrons and which can be modeled as a vacuum. Control of the dark space region advantageously prevents plasma entry into the dark space region, arcing, and plasma instability. A shape of the gap 200 impedes the passage of sputtered plasma species through the gap 200, and thus, reduces the accumulation of sputtered deposits on the surfaces of the peripheral target region.

The backing plate 150 is made from a metal, such as, for example, stainless steel, aluminum, copper-chromium or copper-zinc. The backing plate 150 can be made from a material having a thermal conductivity that is sufficiently high to dissipate the heat generated in the sputtering target 140, which is formed in both the sputtering plate 144 and the backing plate 150. The heat is generated from the eddy currents that arise in the sputtering plate 144 and the backing plate 150 and also from the bombardment of energetic ions from the plasma onto the sputtering surface 139 of the sputtering target 140. The higher thermal conductivity of the backing plate 150 allows dissipation of the heat generated in the sputtering target 140 to the surrounding structures or even to a heat exchanger that may be mounted behind the backing plate 150 or may be in the backing plate 150, itself.

In some embodiments, the sputtering plate 144 may be mounted on the backing plate 150 by diffusion bonding, for example, by placing the sputtering plate 144 on the backing plate 150 and heating the sputtering plate 144 and the backing plate 150 to a suitable temperature, typically at least about 80-200° C. Optionally, the sputtering target 140 may be a monolithic structure comprising a single piece of material having enough depth to serve as both the sputtering plate and backing plate. Also, the sputtering target 140 may be formed of different materials bonded to one another to form an assembly.

The backing plate 150 comprises an outer footing 204 that rests on an isolator 154 in the process chamber 100. The outer footing 204 contains an O-ring groove 206 into which an O-ring 208 is placed to form a vacuum seal. The isolator 154 electrically isolates and separates the backing plate 150 from the process chamber 100 and is typically a ring formed of a dielectric or insulative material such as aluminum oxide. The outer footing 204 is shaped to inhibit the flow or migration of sputtered material and plasma species through a gap between the sputtering target 140 and the isolator 154, to impede the penetration of low-angle sputtered deposits into the gap.

The sputtering target 140 is connected to one or both of a DC power source 146 and an RF power source 148. The DC power source 146 can apply a bias voltage to the sputtering target 140 relative to the inner shield 110a and the outer shield 110b, which may be electrically floating during a sputtering process. At least one of the DC power source 146 and the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104.

The sputtering gas is introduced into the process chamber 100 through a gas delivery system 158, which provides gas from a gas supply (not shown) via conduits (not shown) having gas flow control valves (not shown), such as mass flow controllers, to pass a set flow rate of the gas. The gases are fed to a mixing manifold (not shown) in which the gases are mixed to from a desired process gas composition and fed to a gas distributor (not shown) having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by at least one of the DC power source 146 and the RF power source 148 to form a plasma to sputter the sputtering target 140. Spent process gas and byproducts are exhausted from the process chamber 100 through an exhaust 168. The exhaust 168 comprises an exhaust port 170 that receives spent process gas and passes the spent gas to an exhaust conduit 172 having a throttle valve to control the pressure of the gas in the process chamber 100. The exhaust conduit 172 is connected to one or more exhaust pumps 174.

Various components of the process chamber 100 may be controlled by a controller 176. The controller 176 comprises program code having instruction sets to operate the components to process a substrate 104. For example, the controller 176 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate at least one of the DC power source 146 and the RF power source 148 to set a gas energizing power level; temperature control instruction sets to control a temperature control system in the substrate support 130 or the coolant supply 180 to control a flowrate of the coolant to the coolant channel 152; and process monitoring instruction sets to monitor the process in the process chamber 100.

While the foregoing is directed to embodiments of the present disclosure, other and further embodiments of the disclosure may be devised without departing from the basic scope thereof.

The invention claimed is:
1. An adapter for a deposition chamber comprising:
an adapter body extending longitudinally about a central axis between an upper side and lower side opposite the upper side, the adapter body having a central opening about the central axis, the adapter body having a radially outer portion having a connection surface on the lower side and a radially inner portion having a coolant channel and a stepped surface on the lower side, wherein at least a portion of the coolant channel is spaced radially inwardly from a radially inner end of the connection surface, wherein at least the portion of the coolant channel is disposed longitudinally below the connection surface between the connection surface and the stepped surface, wherein the stepped surface includes a mounting surface configured to mount an outer shield to the adapter body and dispose the outer shield below the stepped surface, and wherein the adapter body is configured to couple to a shield extending from the upper side.

2. The adapter according to claim 1, wherein the coolant channel has a profile that has at least one surface that conforms to at least a portion of the stepped surface.

3. The adapter according to claim 1, wherein the coolant channel has a square or rectangular profile.

4. The adapter according to claim 1, wherein the coolant channel has an L-shaped, mushroom shaped, or T-shaped profile.

5. The adapter according to claim 1, wherein the connection surface is a sealing surface configured to seal with the deposition chamber.

6. The adapter according to claim 1, wherein the radially inner portion of the adapter body has at least one section having an L-shaped or T-shaped profile.

7. The adapter according to claim 6, wherein the coolant channel is disposed in the at least one section having an L-shaped profile.

8. The adapter according to claim 7, wherein the coolant channel has an L-shaped, mushroom shaped, or T-shaped profile.

9. A deposition chamber comprising:
an adapter comprising:
an adapter body extending longitudinally about a central axis between an upper side and lower side opposite the upper side, the adapter body having a central opening about the central axis, the adapter body having a radially outer portion having a connection surface on the lower side and a radially inner portion having a coolant channel and a stepped surface on the lower side,
wherein at least a portion of the coolant channel is spaced radially inwardly from a radially inner end of the connection surface, and
wherein at least the portion of the coolant channel is disposed longitudinally below the connection surface between the connection surface and the stepped surface; and
a chamber body defining an internal cavity surrounding a heater for heating an interior volume of the internal cavity, the chamber body having a connection surface defining an opening of the chamber body coaxial with the central opening of the adapter body, wherein the connection surface of the adapter body is connected to the connection surface of the chamber body;
an outer shield extending longitudinally and radially from the stepped surface; and
an inner shield extending longitudinally and radially from the upper side of the adapter body toward the stepped surface and extending partially over the outer shield.

10. The deposition chamber according to claim 9, wherein the coolant channel has a profile that has at least one surface that conforms to at least a portion of the stepped surface.

11. The deposition chamber according to claim 9, wherein the coolant channel has a square or rectangular profile.

12. The deposition chamber according to claim 9, wherein the coolant channel has an L-shaped, mushroom shaped, or T-shaped profile.

13. The deposition chamber according to claim 9, wherein the coolant channel is disposed in the internal cavity.

14. The deposition chamber according to claim 9, wherein the connection surface of the adapter body is sealed with the connection surface of the deposition chamber.

15. The deposition chamber according to claim 9, wherein the radially inner portion of the adapter body has at least one section having an L-shaped or T-shaped profile.

16. The deposition chamber according to claim 15, wherein the coolant channel is disposed in the at least one section having an L-shaped or T-shaped profile.

17. The deposition chamber according to claim 16, wherein the coolant channel has an L-shaped, mushroom shaped, or T-shaped profile.

18. The deposition chamber according to claim 9, wherein the heater is configured to support and heat a substrate.

19. A process kit for a deposition chamber comprising:
an adapter comprising:
an adapter body extending longitudinally about a central axis between an upper side and lower side opposite the upper side, the adapter body having a central opening about the central axis, the adapter body having a radially outer portion having a connection surface on the lower side and a radially inner portion having a coolant channel and a stepped surface on the lower side,
wherein at least a portion of the coolant channel is spaced radially inwardly from a radially inner end of the connection surface, and
wherein at least the portion of the coolant channel is disposed longitudinally below the connection surface between the connection surface and the stepped surface;
an outer shield extending longitudinally and radially from the stepped surface of the adapter body; and
an inner shield extending longitudinally and radially from an upper surface of the adapter body toward the stepped surface, wherein the inner shield extends partially over the outer shield.

20. The process kit according to claim 19, wherein:
the outer shield has a U-shaped or J-shaped profile having opposing longitudinally extending and radially spaced sides, and
the inner shield has a free end disposed radially between the opposing longitudinally extending sides.

* * * * *